(12) United States Patent
Yamada et al.

(10) Patent No.: US 8,987,123 B2
(45) Date of Patent: Mar. 24, 2015

(54) HEAT TREATMENT APPARATUS AND HEAT TREATMENT METHOD FOR HEATING SUBSTRATE BY IRRADIATING SUBSTRATE WITH FLASH OF LIGHT

(71) Applicant: Dainippon Screen Mfg. Co., Ltd., Kyoto (JP)

(72) Inventors: Takahiro Yamada, Kyoto (JP); Kenichi Yokouchi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 83 days.

(21) Appl. No.: 13/790,313

(22) Filed: Mar. 8, 2013

(65) Prior Publication Data

US 2013/0260546 A1    Oct. 3, 2013

(30) Foreign Application Priority Data

Mar. 28, 2012 (JP) ................................. 2012-073466

(51) Int. Cl.
    *H01L 21/223*      (2006.01)
    *H01L 21/67*      (2006.01)

(52) U.S. Cl.
    CPC ........ *H01L 21/223* (2013.01); *H01L 21/67115* (2013.01)
    USPC ............................ 438/565; 438/795; 392/416

(58) Field of Classification Search
None
See application file for complete search history.

(56) References Cited

U.S. PATENT DOCUMENTS

| 4,567,352 | A | * | 1/1986 | Mimura et al. | 219/405 |
| 2009/0175605 | A1 | | 7/2009 | Kobayashi | 392/416 |
| 2009/0275212 | A1 | * | 11/2009 | Kato | 438/769 |

FOREIGN PATENT DOCUMENTS

JP      2009-164451      7/2009

* cited by examiner

*Primary Examiner* — Angel Roman
(74) *Attorney, Agent, or Firm* — Ostrolenk Faber LLP

(57) ABSTRACT

After the completion of the transport of a semiconductor wafer into a chamber, the flow rate of nitrogen gas supplied into the chamber is decreased. In this state, a preheating treatment and flash irradiation are performed. The flow rate of nitrogen gas supplied into the chamber is increased when the temperature of the front surface of the semiconductor wafer is decreased to become equal to the temperature of the back surface thereof after reaching its maximum temperature by the irradiation of the substrate with a flash of light. Thereafter, the supply flow rate of nitrogen gas is maintained at a constant value until the semiconductor wafer is transported out of the chamber. This achieves the reduction in particles deposited on the semiconductor wafer while suppressing adverse effects resulting from the nonuniform in-plane temperature distribution of the semiconductor wafer.

12 Claims, 13 Drawing Sheets

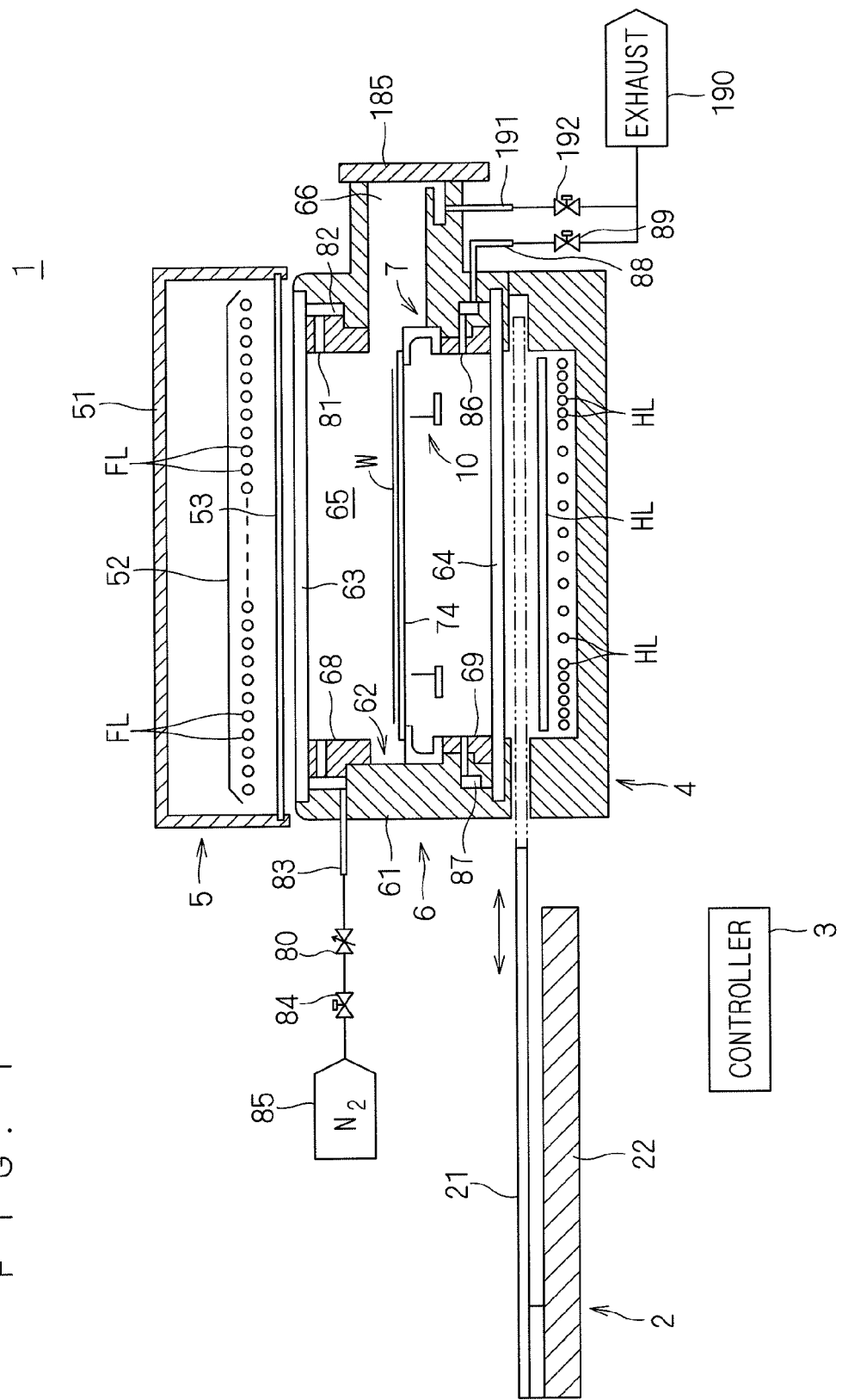
F I G . 1

F I G . 4
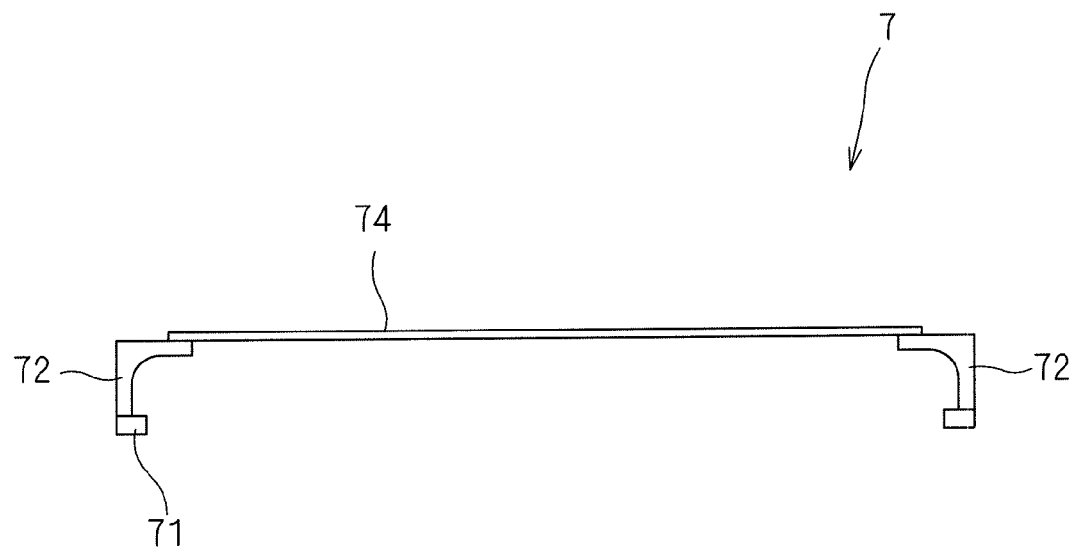

F I G. 5
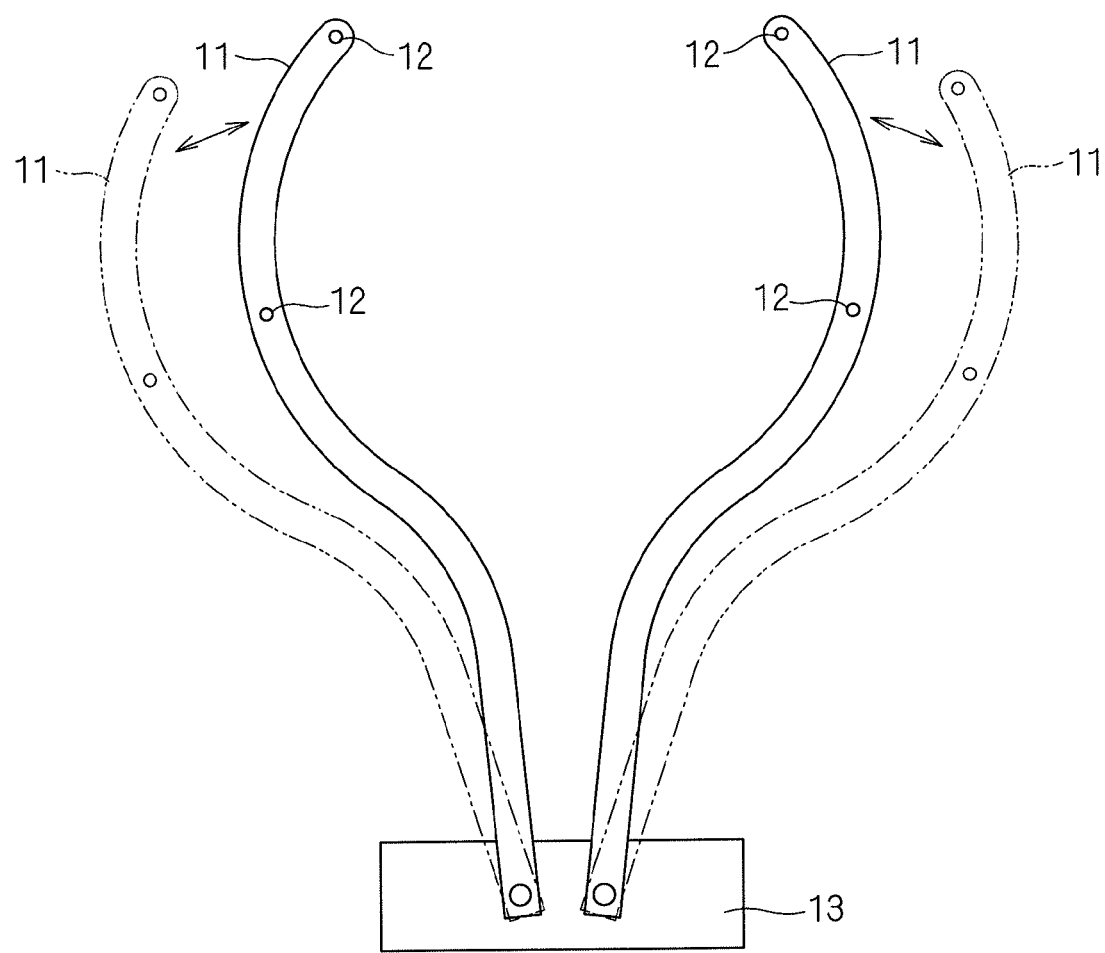

F I G. 6
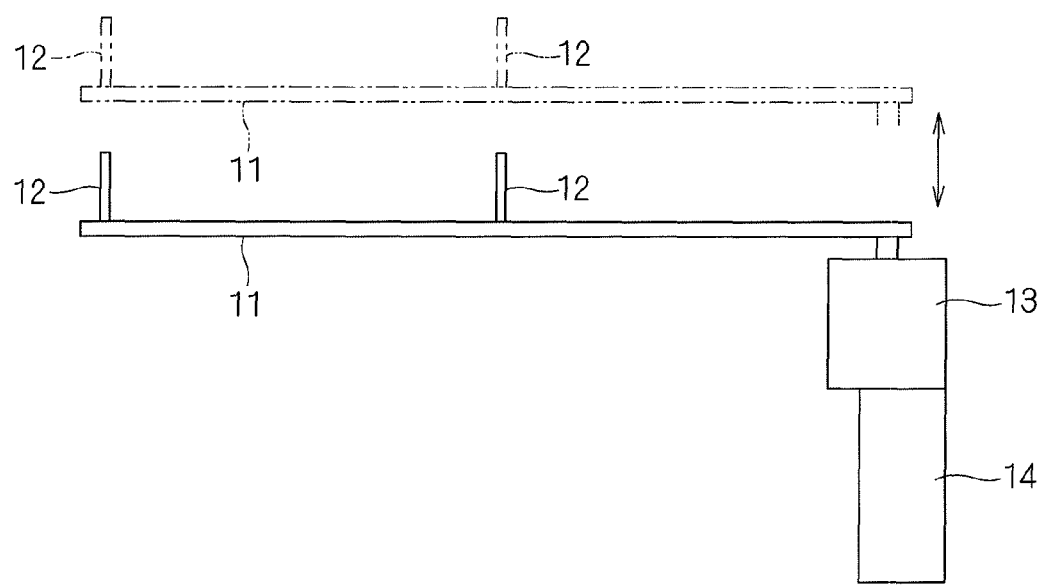

F I G. 7
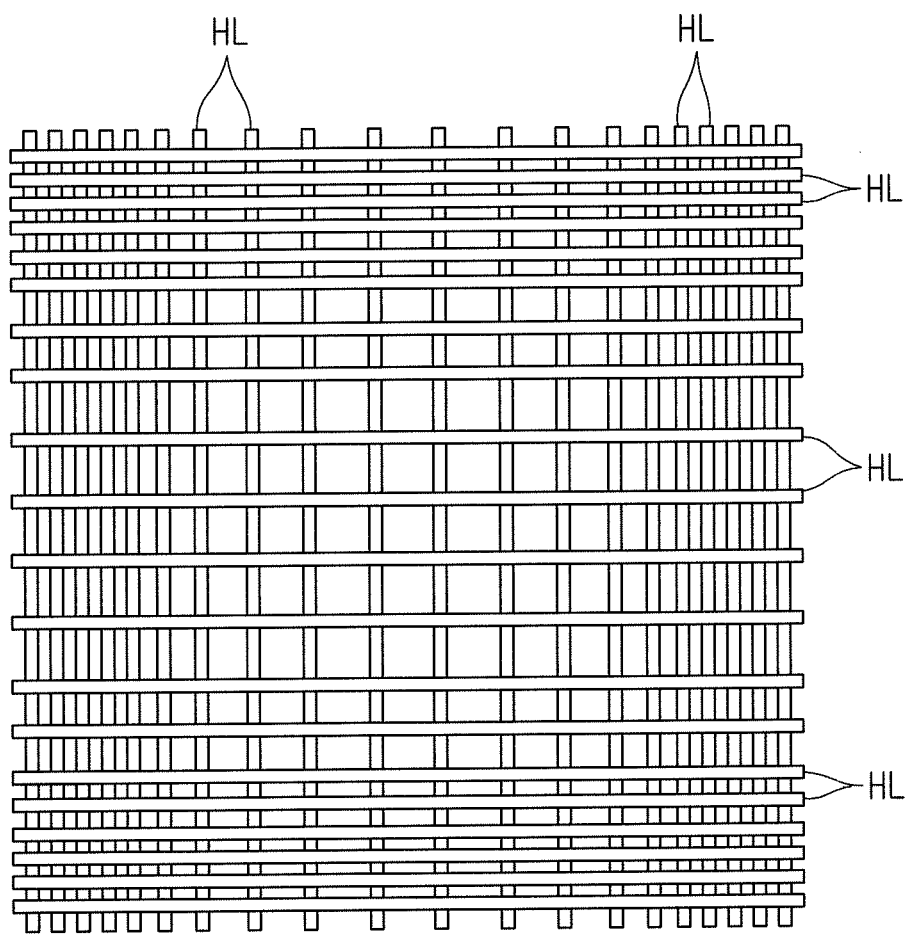

F I G. 1 0
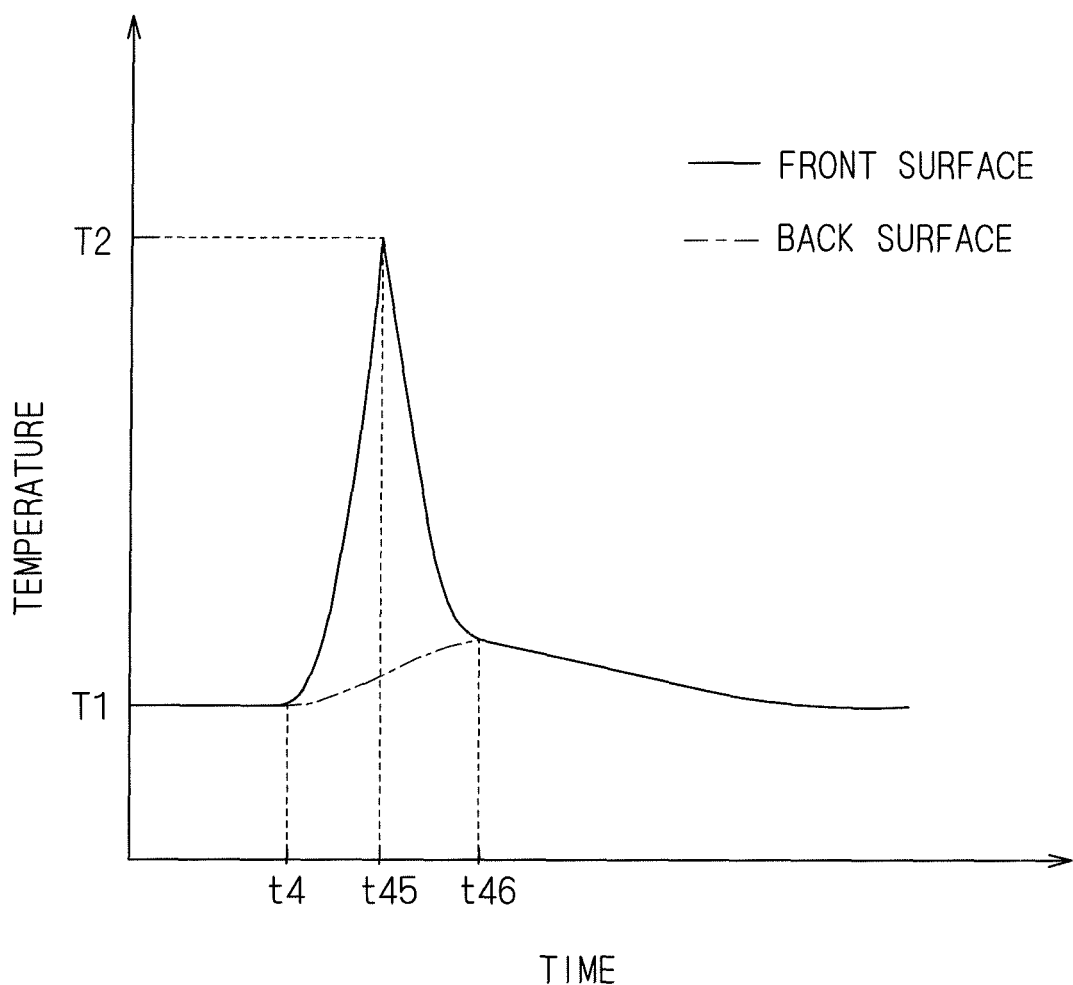

F I G . 1 2
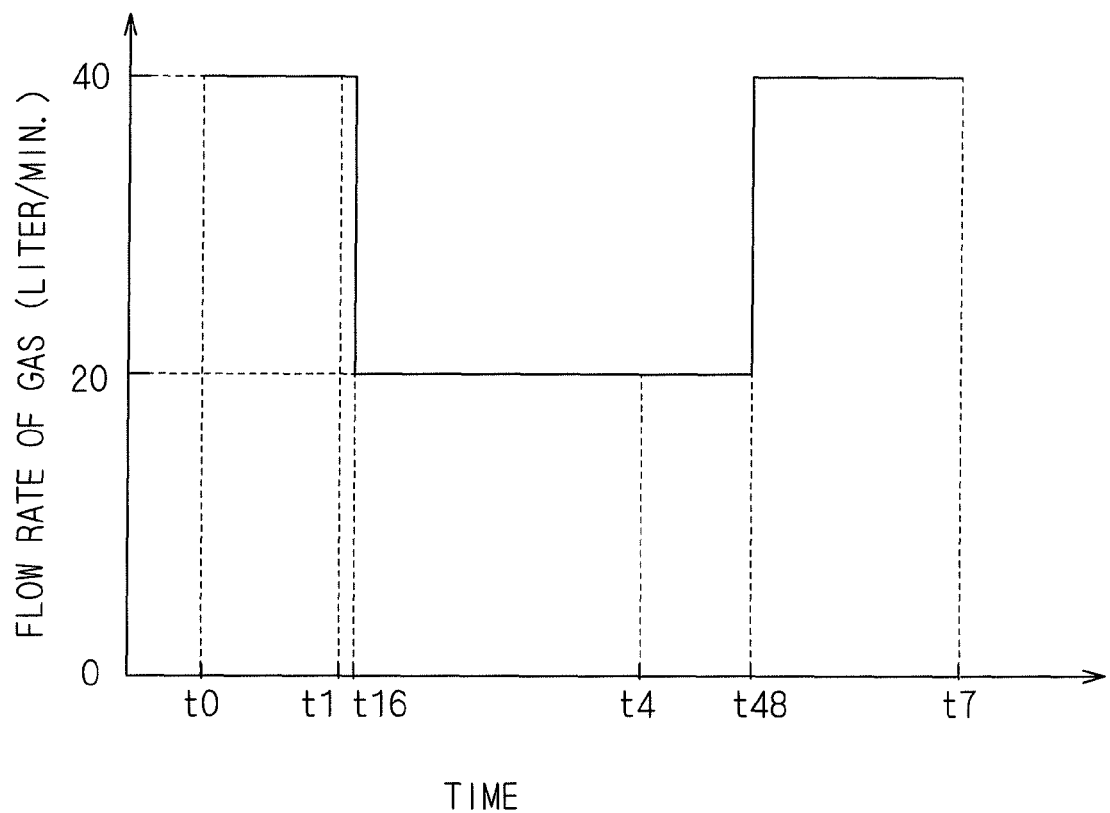

F I G . 1 3
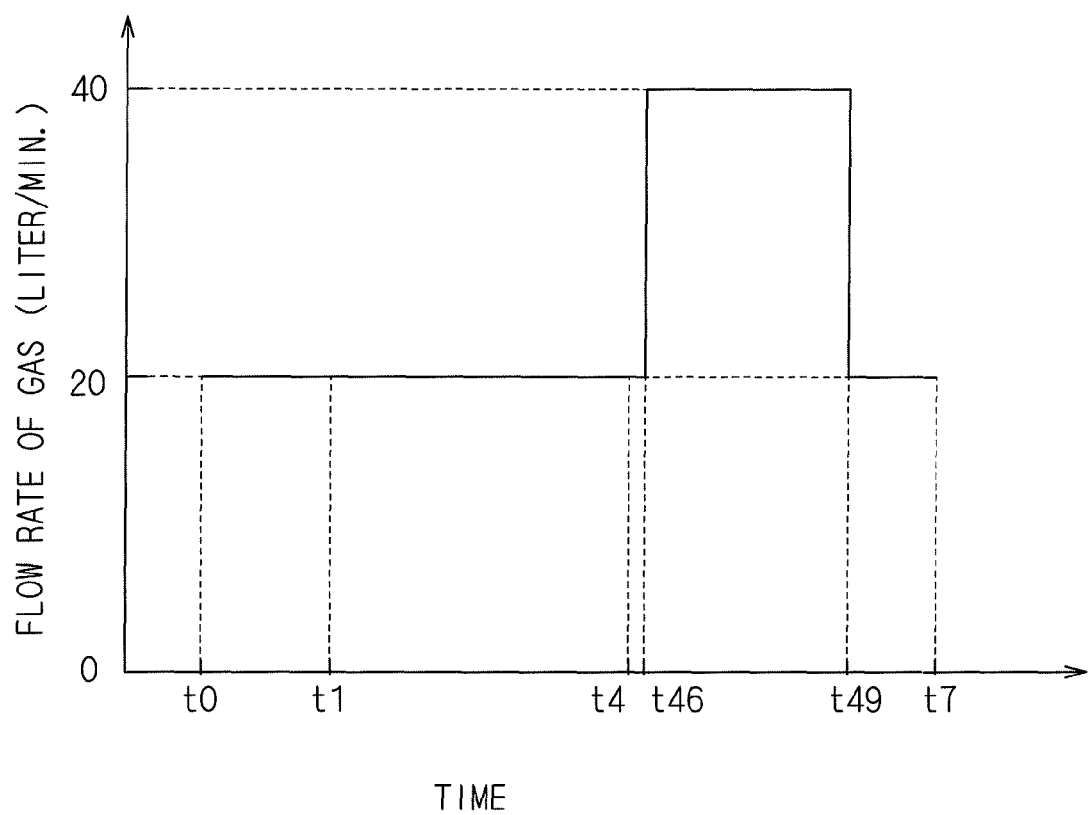

HEAT TREATMENT APPARATUS AND HEAT TREATMENT METHOD FOR HEATING SUBSTRATE BY IRRADIATING SUBSTRATE WITH FLASH OF LIGHT

BACKGROUND OF THE INVENTION

1. Field of the Invention

The present invention relates to a heat treatment apparatus and a heat treatment method for heating a thin plate-like precision electronic substrate such as a semiconductor wafer and a glass substrate for a liquid crystal display device (hereinafter referred to simply as a "substrate") by irradiating the substrate with a flash of light.

2. Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

A heat treatment apparatus which employs such xenon flash lamps is disclosed in U.S. Patent Application Publication No. 2009/0175605 in which flash lamps are disposed on the front surface side of a semiconductor wafer and halogen lamps are disposed on the back surface side thereof so that a desired heat treatment is performed using a combination of these lamps. In the heat treatment apparatus disclosed in U.S. Patent Application Publication No. 2009/0175605, a semiconductor wafer held on a susceptor is preheated to a certain degree of temperature by the halogen lamps. Thereafter, the temperature of the semiconductor wafer is raised to a desired treatment temperature by flash irradiation from the flash lamps.

The heat treatment apparatus employing such xenon flash lamps as disclosed in U.S. Patent Application Publication No. 2009/0175605, which momentarily irradiates the front surface of a semiconductor wafer with a flash of light having ultrahigh energy, raises the temperature of the front surface of the semiconductor wafer rapidly for a very short period of time. As a result, abrupt thermal expansion of the front surface of the semiconductor wafer causes the semiconductor wafer to become deformed. This results in a phenomenon in which the semiconductor wafer vibrates on the susceptor or jumps up from the susceptor when flash irradiation is performed. Such a phenomenon gives rise to a problem in which the sliding movement of the semiconductor wafer over the susceptor and the turbulence in the flow of gas which result from the vibrations (or the jumping) of the semiconductor wafer create particles in a chamber, and the particles are deposited on the semiconductor wafer.

SUMMARY OF THE INVENTION

The present invention is intended for a heat treatment apparatus for heating a substrate by irradiating the substrate with a flash of light.

According to one aspect of the present invention, the heat treatment apparatus comprises: a chamber for receiving a substrate therein; a holder for holding the substrate in the chamber; a preheating part for heating the substrate held by the holder to a predetermined preheating temperature; a flash lamp for irradiating a first surface of the substrate held by the holder with a flash of light; a gas supply part for supplying an inert gas into the chamber; an exhaust part for exhausting an atmosphere from the chamber; and a flow rate controller increasing the flow rate of the inert gas supplied from the gas supply part into the chamber when the temperature of the first surface of the substrate held by the holder is decreased to a predetermined temperature after reaching its maximum temperature by the irradiation of the substrate with a flash of light.

The heat treatment apparatus is capable of effectively discharging particles created in association with the flash irradiation from the chamber to achieve the reduction in the particles deposited on the substrate while suppressing adverse effects resulting from the nonuniform in-plane temperature distribution of the substrate.

Preferably, the flow rate controller increases the flow rate of the inert gas supplied from the gas supply part into the chamber to a flow rate equal to that during the transport of the substrate out of the chamber when the temperature of the first surface of the substrate is decreased to the predetermined temperature.

This prevents particles from swirling up due to a change in the velocity of the gas flow during the transport of the substrate out of the chamber to further reduce the particles deposited on the substrate.

According to another aspect of the present invention, the heat treatment apparatus comprises: a chamber for receiving a substrate therein; a holder for holding the substrate in the chamber; a preheating part for heating the substrate held by the holder to a predetermined preheating temperature; a flash lamp for irradiating a first surface of the substrate held by the holder with a flash of light; a gas supply part for supplying an inert gas into the chamber; an exhaust part for exhausting an atmosphere from the chamber; and a flow rate controller increasing the flow rate of the inert gas supplied from the gas supply part into the chamber at any time between the instant of the irradiation of the substrate held by the holder with a flash of light and the instant of the transport of the substrate out of the chamber, and maintaining the flow rate until the transport of the substrate out of the chamber.

The heat treatment apparatus prevents particles from swirling up due to a change in the velocity of the gas flow during the transport of the substrate out of the chamber to reduce the particles deposited on the substrate in association with the flash irradiation.

The present invention is also intended for a method of heating a substrate by irradiating the substrate with a flash of light.

According to one aspect of the present invention, the method comprises the steps of: (a) heating a substrate held in a chamber to a predetermined preheating temperature; (b) irradiating a first surface of the substrate heated to the preheating temperature with a flash of light from a flash lamp; and (c) increasing the flow rate of an inert gas supplied into the chamber when the temperature of the first surface of the substrate is decreased to a predetermined temperature after reaching its maximum temperature by the irradiation of the substrate with a flash of light.

The method is capable of effectively discharging particles created in association with the flash irradiation from the chamber to achieve the reduction in the particles deposited on the substrate while suppressing adverse effects resulting from the nonuniform in-plane temperature distribution of the substrate.

Preferably, the flow rate of the inert gas supplied into the chamber is increased to a flow rate equal to that during the transport of the substrate out of the chamber in the step (c) when the temperature of the first surface of the substrate is decreased to the predetermined temperature.

This prevents particles from swirling up due to a change in the velocity of the gas flow during the transport of the substrate out of the chamber to further reduce the particles deposited on the substrate.

According to another aspect of the present invention, the method comprises the steps of: (a) heating a substrate held in a chamber to a predetermined preheating temperature; (b) irradiating a first surface of the substrate heated to the preheating temperature with a flash of light from a flash lamp; and (c) increasing the flow rate of the inert gas supplied into the chamber at any time between the instant of the irradiation of the substrate with a flash of light and the instant of the transport of the substrate out of the chamber, and maintaining the flow rate until the transport of the substrate out of the chamber.

The method prevents particles from swirling up due to a change in the velocity of the gas flow during the transport of the substrate out of the chamber to reduce the particles deposited on the substrate in association with the flash irradiation.

It is therefore an object of the present invention to reduce particles deposited on a substrate in association with flash irradiation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal sectional view showing a configuration of a heat treatment apparatus according to the present invention;

FIG. 4 is a side view of the holder as seen from one side;

FIG. 5 is a plan view of a transfer mechanism;

FIG. 6 is a side view of the transfer mechanism;

FIG. 7 is a plan view showing an arrangement of halogen lamps;

FIG. 10 is a graph showing changes in the temperatures of the front and back surfaces of a semiconductor wafer when flash irradiation is performed;

FIG. 12 is a graph showing another example of the flow rate of nitrogen gas supplied into the chamber; and FIG. 13 is a graph showing still another example of the flow rate of nitrogen gas supplied into the chamber.

DESCRIPTION OF THE PREFERRED EMBODIMENTS

Figure 2:
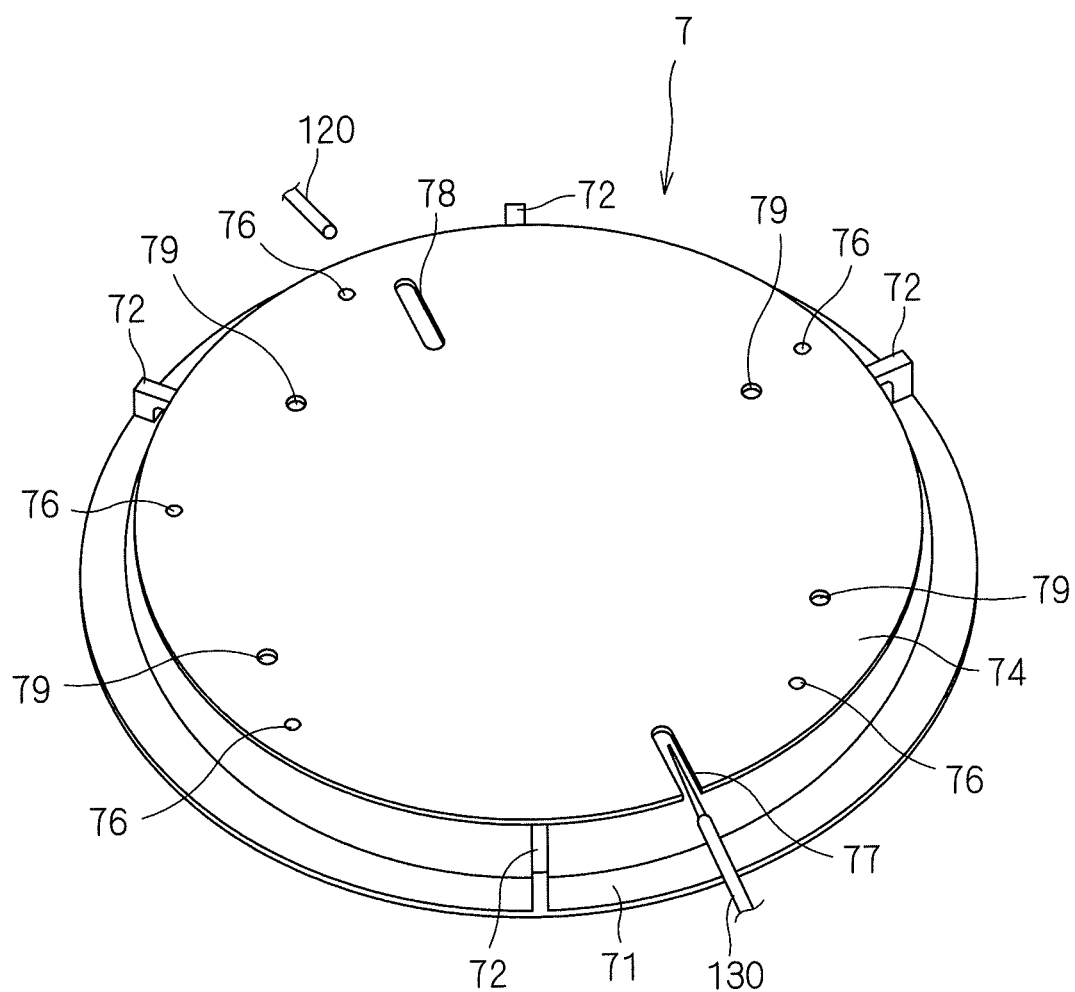
FIG. 2 is a perspective view showing the entire external appearance of a holder.

A preferred embodiment according to the present invention will now be described in detail with reference to the drawings.

FIG. 1 is a longitudinal sectional view showing a configuration of a heat treatment apparatus 1 according to the present invention. The heat treatment apparatus 1 according to a preferred embodiment of the present invention is a flash lamp annealer for irradiating a disk-shaped silicon semiconductor wafer W having a diameter of 300 mm and serving as a substrate with a flash of light to heat the semiconductor wafer W. A semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the shutter mechanism 2, the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W.

The chamber side portion 61, and the upper and lower reflective rings 68 and 69 are made of a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas (in this preferred embodiment, nitrogen ($N_2$) gas serving as an inert gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 and a flow regulating valve 80 are inserted at certain midpoints in the gas supply pipe 83. When the valve 84 is opened, nitrogen gas is fed from the nitrogen gas supply source 85 to the buffer space 82. The flow rate of nitrogen gas flowing through the gas supply pipe 83 is regulated by the flow regulating valve 80. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The nitrogen gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 3:
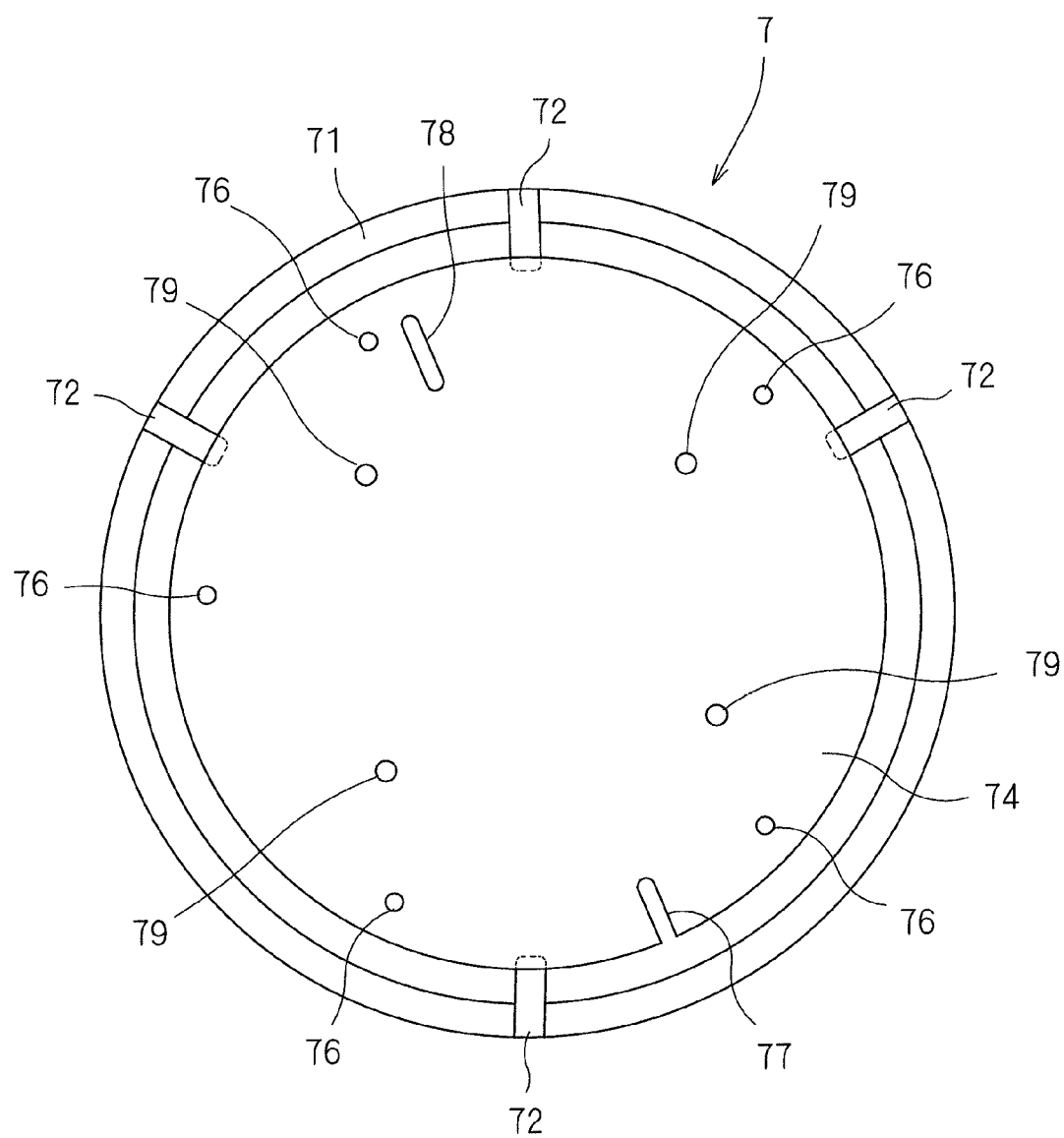
FIG. 3 is a top plan view of the holder.

FIG. 2 is a perspective view showing the entire external appearance of the holder 7. FIG. 3 is a top plan view of the holder 7. FIG. 4 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in this preferred embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The susceptor 74 having a planar shape is supported by the four coupling portions 72 provided on the base ring 71. The susceptor 74 is a generally circular planar member made of quartz. The diameter of the susceptor 74 is greater than that of a semiconductor wafer W. In other words, the susceptor 74 has a size, as seen in plan view, greater than that of the semiconductor wafer W. Multiple (in this preferred embodiment, five) guide pins 76 are mounted upright on the upper surface of the susceptor 74. The five guide pins 76 are disposed along the circumference of a circle concentric with the outer circumference of the susceptor 74. The diameter of a circle on which the five guide pins 76 are disposed is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by welding and the like.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a generally disc-shaped configuration assumes a horizontal attitude (an attitude such that the normal to the susceptor 74 coincides with a vertical direction). A semiconductor wafer W transported into the chamber 6 is placed and held in a horizontal attitude on the susceptor 74 of the holder 7 mounted to the chamber 6. The semiconductor wafer W is placed inside the circle defined by the five guide pins 76. This prevents the horizontal misregistration of the semiconductor wafer W. The number of guide pins 76 is not limited to five, but may be determined so as to prevent the misregistration of the semiconductor wafer W.

As shown in FIGS. 2 and 3, an opening 78 and a notch 77 are provided in the susceptor 74 so as to extend vertically through the susceptor 74. The notch 77 is provided to allow a distal end portion of a probe of a contact-type thermometer 130 including a thermocouple to pass therethrough. The opening 78, on the other hand, is provided for a radiation thermometer 120 to receive radiation (infrared radiation) emitted from the lower surface of the semiconductor wafer W held by the susceptor 74. The susceptor 74 further includes four through holes 79 bored therein and designed so that lift pins 12 of the transfer mechanism 10 to be described later pass through the through holes 79, respectively, to transfer a semiconductor wafer W.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in this preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The multiple (in the present preferred embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 7 is a plan view showing an arrangement of the multiple halogen lamps HL. In the present preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals near the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

Also as shown in FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light (light from a halogen light source), and is made of titanium (Ti), for example. The sliding drive mechanism 22 causes the shutter plate 21 to slidably move in a horizontal direction, thereby bringing the shutter plate 21 into and out of a light shielding position lying between the halogen heating part 4 and the holder 7. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the holder 7 in the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 8:
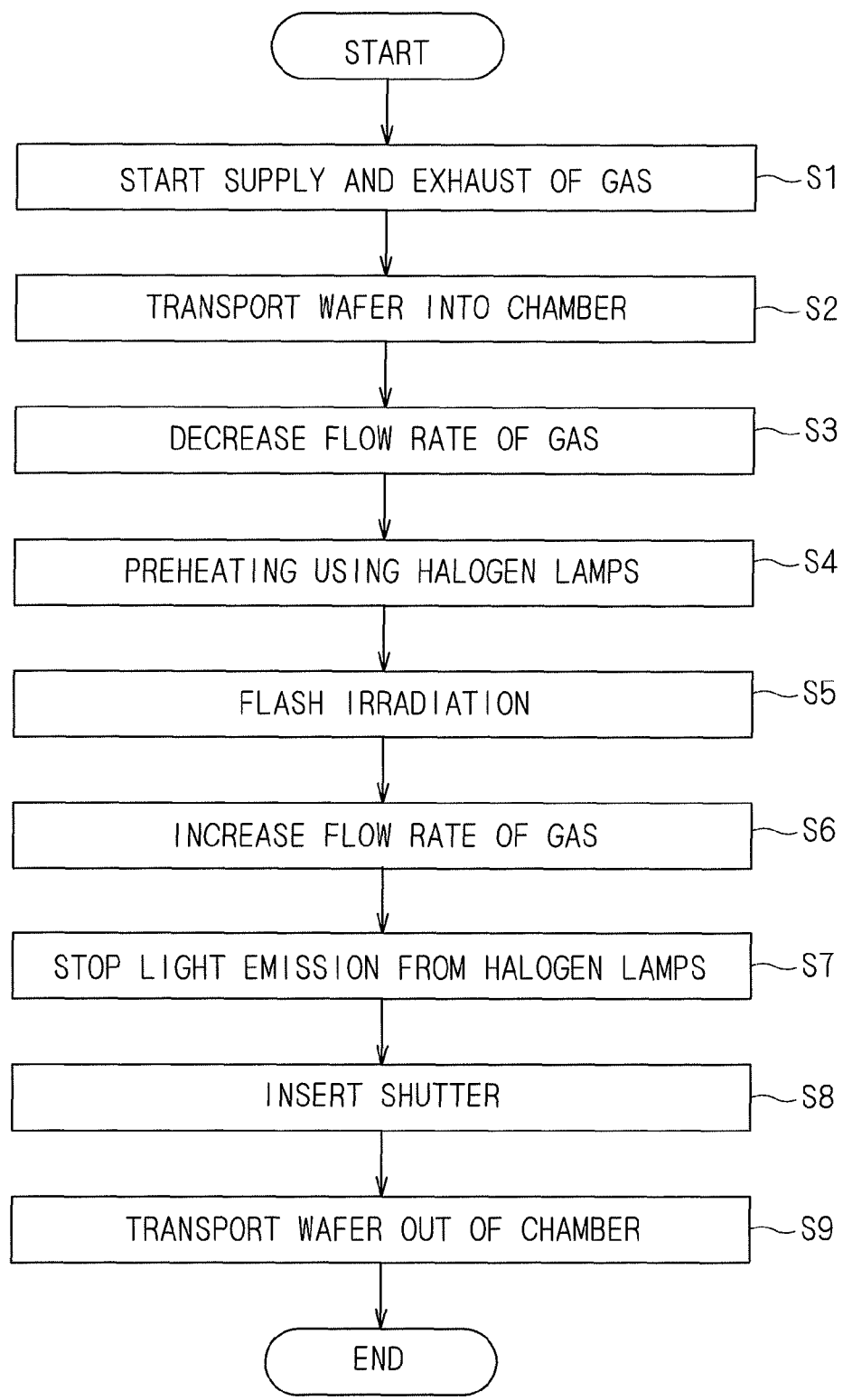
FIG. 8 is a flow diagram showing a procedure for treatment of a semiconductor wafer in the heat treatment apparatus of FIG. 1.

Next, a procedure for the treatment of a semiconductor wafer W in the heat treatment apparatus 1 will be described. A semiconductor wafer W to be treated herein is a semiconductor substrate of silicon with a front surface implanted with impurities (ions) by an ion implantation process. The impurities are activated by the heat treatment apparatus 1 performing the process of heating (annealing) the semiconductor wafer W by flash irradiation. FIG. 8 is a flow diagram showing a procedure for the treatment of a semiconductor wafer W in the heat treatment apparatus 1. The procedure for the treatment of a semiconductor wafer W which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start (in Step S1). When the valve 84 is opened, nitrogen gas serving as an inert gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. The flow rate of nitrogen gas supplied into the chamber 6 is regulated by the flow regulating valve 80 under the control of the controller 3, and shall be 40 liters per minute, for example, when a semiconductor wafer W is transported into the chamber 6.

Subsequently, the gate valve 185 is opened to open the transport opening 66. A transport robot outside the heat treatment apparatus 1 transports a semiconductor wafer W implanted with impurities through the transport opening 66 into the heat treatment space 65 of the chamber 6 (in Step S2). At this time, there is a danger that an atmosphere outside the heat treatment apparatus 1 is carried into the heat treatment space 65 as the semiconductor wafer W is transported into the heat treatment space 65. However, the nitrogen gas is supplied at a flow rate of 40 liters per minute into the chamber 6 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude. The semiconductor wafer W is held by the susceptor 74 in such an attitude that a surface thereof which is patterned and implanted with impurities is the upper surface. Also, the semiconductor wafer W is held inside the five guide pins 76 on the upper surface of the susceptor 74. The pair of transfer arms 11 moved downwardly below the susceptor 74 is moved back to the retracted position, i.e. to the inside of the recessed portion 62, by the horizontal movement mechanism 13.

The controller 3 controls the flow regulating valve 80 so that the flow rate of nitrogen gas supplied into the chamber 6 is decreased when the transport of the semiconductor wafer W into the heat treatment space 65 is completed and the transport opening 66 is closed by the gate valve 185 (in Step S3). The supply flow rate of nitrogen gas after the completion of the transport of the semiconductor wafer W into the heat treatment space 65 shall be 20 liters per minute, for example.

After the semiconductor wafer W is transported into the heat treatment space 65 and the flow rate of nitrogen gas supplied into the chamber 6 is decreased, the 40 halogen lamps HL in the halogen heating part 4 turn on simultaneously to start preheating (or assist-heating) (in Step S4). Halogen light emitted from the halogen lamps HL is transmitted through the lower chamber window 64 and the susceptor 74 both made of quartz, and impinges upon the back surface (a main surface opposite from the front surface) of the semiconductor wafer W. The semiconductor wafer W is irradiated with the halogen light from the halogen lamps HL, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

Figure 9:
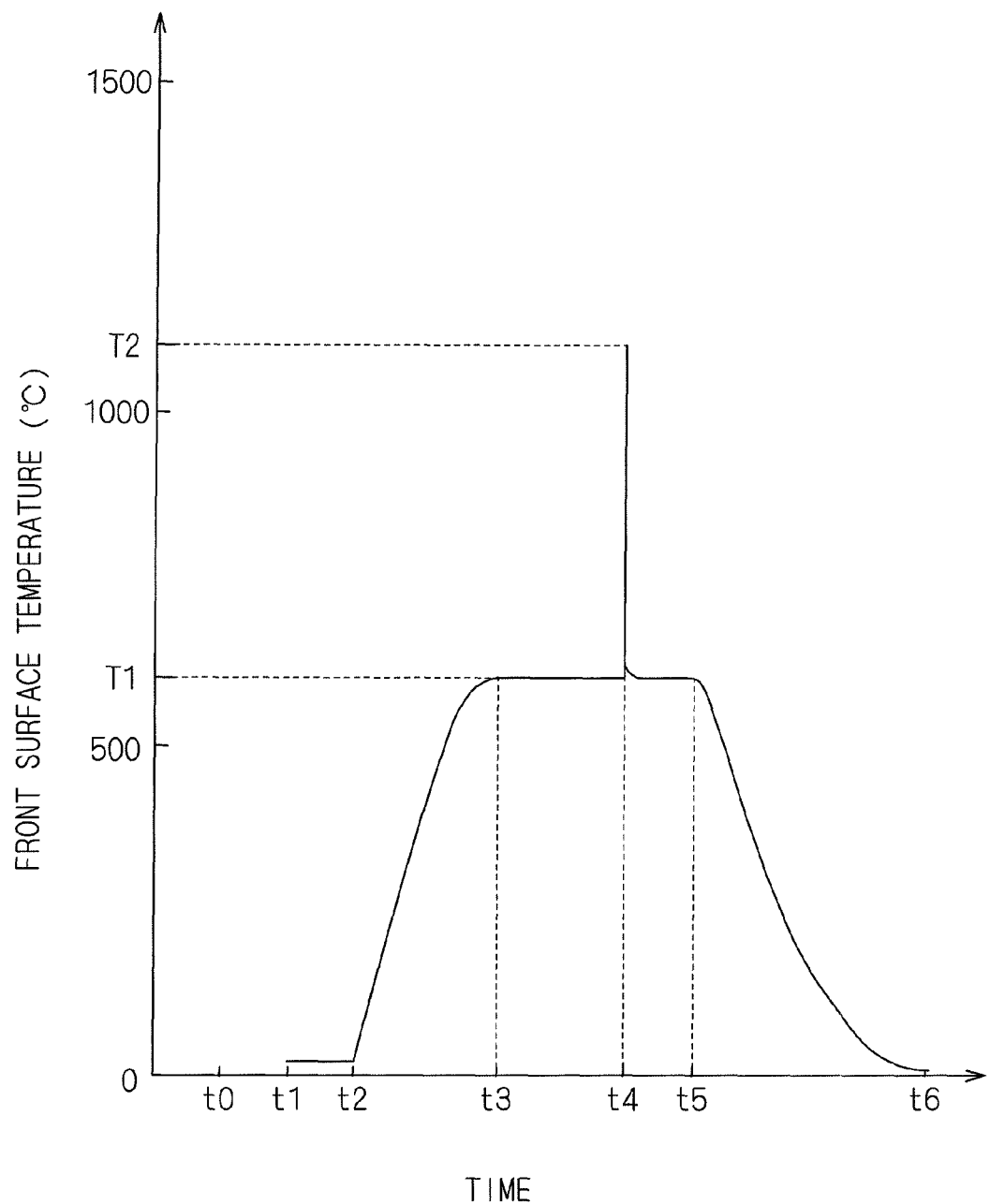
FIG. 9 is a graph showing changes in the temperature of the front surface of a semiconductor wafer.

FIG. 9 is a graph showing changes in the temperature of the front surface of the semiconductor wafer W. The supply and exhaust of gas into and out of the chamber 6 start at time t0, and the semiconductor wafer W at room temperature is transported into the chamber 6 at time t1. After the semiconductor wafer W is placed on the susceptor 74, the controller 3 turns on the 40 halogen lamps HL at time t2, so that the temperature of the semiconductor wafer W irradiated with the halogen light is increased to a preheating temperature T1. The preheating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

The temperature of the semiconductor wafer W is measured with the contact-type thermometer 130 when the halogen lamps HL perform the preheating. Specifically, the contact-type thermometer 130 incorporating a thermocouple comes through the notch 77 into contact with the lower surface of the semiconductor wafer W held by the susceptor 74 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches the predetermined preheating temperature T1 or not. In other words, the controller 3 effects feedback control of the output from the halogen lamps HL, based on the value measured with the contact-type thermometer 130, so that the temperature of the semiconductor wafer W is equal to the preheating temperature T1. It should be noted that, when the temperature of the semiconductor wafer W is increased by the irradiation with light from the halogen lamps HL, the temperature is not measured with the radiation thermometer 120. This is because the halogen light emitted from the halogen lamps HL enters the radiation thermometer 120 in the form of disturbance light to obstruct the precise measurement of the temperature.

After the temperature of the semiconductor wafer W reaches the preheating temperature T1, the controller 3 maintains the temperature of the semiconductor wafer W at the preheating temperature T1 for a short time. Specifically, at time t3 when the temperature of the semiconductor wafer W measured with the contact-type thermometer 130 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL emit a flash of light to perform a heating treatment at time t4 when a predetermined time period has elapsed since the temperature of the semiconductor wafer W reached the preheating temperature T1 (in Step S5). Part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W. It should be noted that a time period required for the temperature of the semiconductor wafer W at room temperature to reach the preheating temperature T1 (a time interval between the time t2 and the time t3) is only on the order of several seconds, and that a time period required between the instant at which the temperature of the semiconductor wafer W reaches the preheating temperature T1 and the instant at which the flash lamps FL emit light (a time interval between the time t3 and the time t4) is also only on the order of several seconds.

The flash heating, which is achieved by the emission of a flash of light from the flash lamps FL, increases the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the previously stored electrostatic energy into such an ultrashort light pulse. The temperature of the front surface of the semiconductor wafer W subjected to the flash heating by the flash irradiation from the flash lamps FL momentarily increases to a treatment temperature T2 of 1000° C. or higher. After the impurities implanted in the semiconductor wafer W are activated, the temperature of the front surface of the semiconductor wafer W decreases rapidly. The treatment temperature T2 is in the range of 1000° to 1400° C. where the activation of the implanted impurities is achieved, and shall be 1100° C. in the present preferred embodiment.

Because of the capability of increasing and decreasing the temperature of the front surface of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

Subsequently, the controller 3 controls the flow regulating valve 80 so that the flow rate of nitrogen gas supplied into the chamber 6 is increased immediately after the flash irradiation from the flash lamps FL (in Step S6). More specifically, the flow rate of nitrogen gas supplied into the chamber 6 is increased at the time when the temperature of the front surface of the semiconductor wafer W which is increased to the treatment temperature T2 by the flash irradiation becomes equal to the temperature of the back surface thereof.

FIG. 10 is a graph showing changes in the temperatures of the front and back surfaces of a semiconductor wafer W when flash irradiation is performed. In FIG. 10, the changes in the temperature of the front surface of the semiconductor wafer W is indicated by solid lines, and the changes in the temperature of the back surface thereof is indicated by dash-dot lines. The flash irradiation at the time t4 causes the temperature of the front surface of the semiconductor wafer W which is equal to the preheating temperature T1 to reach the treatment temperature T2 which is its maximum temperature at time t45. Thereafter, the temperature of the front surface of the semiconductor wafer W decreases rapidly because of the conduction of heat from the front surface to the back surface.

On the other hand, the temperature of the back surface of the semiconductor wafer W is increased gradually from the preheating temperature T1 by the conduction of heat from the front surface. In this manner, when a flash of light is emitted for an extremely short period of time ranging from about 0.1 to about 100 milliseconds, the temperature of only the front surface of the semiconductor wafer W earlier increases rapidly and then decreases rapidly, and the temperature of the back surface thereof later increases gradually. Then, the temperature of the front surface of the semiconductor wafer W becomes equal to the temperature of the back surface thereof at time t46. After the time t46 at which the temperatures of the front and back surfaces become equal to each other, the conduction of heat in the direction of the thickness of the semiconductor wafer W does not occur, so that the temperature of the entire semiconductor wafer W decreases gradually to the preheating temperature T1. The time interval between the time t4 at which the flash irradiation is started and the time t46 at which the temperatures of the front and back surfaces become equal to each other is approximately 15 milliseconds for a silicon semiconductor wafer W having a diameter of 300 mm (and having a standardized thickness of 0.775 mm).

In the present preferred embodiment, the flow rate of nitrogen gas supplied into the chamber 6 is increased to 40 liters per minute at the time t46 at which the temperature of the front surface of the semiconductor wafer W is decreased to become equal to the temperature of the back surface thereof after reaching the treatment temperature T2 which is its maximum temperature by the flash irradiation at the time t4. The temperature of the front surface of the semiconductor wafer W (which is equal to the temperature of the back surface) at the time t46 at which the temperatures of the front and back surfaces become equal to each other is considerably lower than the treatment temperature T2. At such a low temperature, the diffusion and inactivation of impurities implanted in the front surface do not occur.

The halogen lamps HL turn off at time t5 which is a predetermined time period later than the time at which the flash irradiation is completed and the flow rate of nitrogen gas supplied into the chamber 6 is increased (in Step S7). This causes the temperature of the semiconductor wafer W to start decreasing from the preheating temperature T1. At the same time that the halogen lamps HL turn off, the shutter mechanism 2 inserts the shutter plate 21 into the light shielding position lying between the halogen heating part 4 and the chamber 6 (in Step S8). The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the rate at which the temperature of the semiconductor wafer W decreases.

At the time of the insertion of the shutter plate 21 into the light shielding position, the radiation thermometer 120 starts measuring the temperature. Specifically, the radiation thermometer 120 measures the intensity of infrared radiation emitted from the lower surface of the semiconductor wafer W held by the holder 7 through the opening 78 of the susceptor 74 to measure the temperature of the semiconductor wafer W which is on the decrease. The measured temperature of the semiconductor wafer W is transmitted to the controller 3.

Some radiant light is continuously emitted from the halogen lamps HL at elevated temperature immediately after the turning off. The radiation thermometer 120, however, measures the temperature of the semiconductor wafer W when the shutter plate 21 is inserted in the light shielding position. Thus, the radiant light directed from the halogen lamps HL toward the heat treatment space 65 of the chamber 6 is interrupted. This allows the radiation thermometer 120 to precisely measure the temperature of the semiconductor wafer W held by the susceptor 74 without being influenced by disturbance light.

The controller 3 monitors whether the temperature of the semiconductor wafer W measured with the radiation thermometer 120 is decreased to a predetermined temperature or not. After the temperature of the semiconductor wafer W is decreased to the predetermined temperature or below, the pair of transfer arms 11 of the transfer mechanism 10 is moved horizontally again from the retracted position to the transfer operation position and is then moved upwardly, whereby the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside (in Step S9). Thus, the heat treatment apparatus 1 completes the heating treatment of the semiconductor wafer W.

The flow rate of nitrogen gas supplied into the chamber 6 is 40 liters per minute when the transport opening 66 is opened and the semiconductor wafer W is transported to the outside. Specifically, the flow rate of nitrogen gas supplied into the chamber 6 is increased to 40 liters per minute at the time t46 at which the temperatures of the front and back surfaces become equal to each other after the flash irradiation, and is maintained thereat until the semiconductor wafer W is transported out of the chamber 6.

Figure 11:
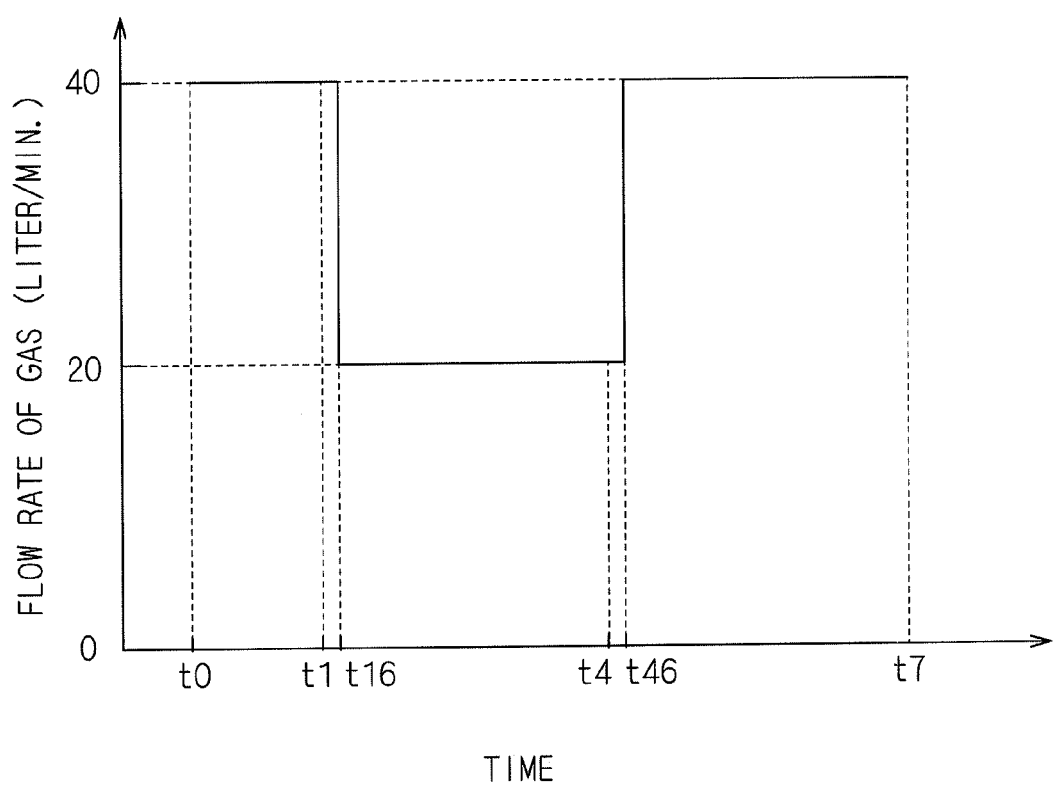
FIG. 11 is a graph showing changes in the flow rate of nitrogen gas supplied into a chamber.

FIG. 11 is a graph showing changes in the flow rate of nitrogen gas supplied into the chamber 6. In the present preferred embodiment, the supply of nitrogen gas starts at a flow rate of 40 liters per minute (a high flow rate) at the time t0 prior to the transport of the semiconductor wafer W into the chamber 6. At the time t1 at which the transport opening 66 is opened and the semiconductor wafer W is transported into the chamber 6, the flow rate of nitrogen gas supplied into the chamber 6 is maintained at 40 liters per minute. This minimizes the outside atmosphere carried through the transport opening 66 into the chamber 6.

The flow rate of nitrogen gas supplied into the chamber 6 is decreased to 20 liters per minute (a low flow rate) at time t16 at which the transport of the semiconductor wafer W into the chamber 6 is completed and the transport opening 66 is closed. The nitrogen gas continues to be supplied at the flow rate of 20 liters per minute into the chamber 6, and the preheating and the flash heating of the semiconductor wafer W are performed in an atmosphere in which a nitrogen gas flow is produced. The flow rate of nitrogen gas supplied into the chamber 6 is decreased when the heating treatment is performed on the semiconductor wafer W. Thus, the nitrogen gas flow exerts a little influence on the temperature distribution of the semiconductor wafer W. This provides a uniform in-plane temperature distribution of the semiconductor wafer W during the heating treatment. Also, the rate of increase in the temperature of the semiconductor wafer W is not decreased in the stage of preheating. This prevents the deterioration of the efficiency of energy consumption.

The flash irradiation is performed at the time t4. The flow rate of nitrogen gas supplied into the chamber 6 is increased again to 40 liters per minute at the time t46 at which the temperature of the front surface of the semiconductor wafer W is decreased to become equal to the temperature of the back surface after reaching the treatment temperature T2 which is its maximum temperature by the flash irradiation at the time t4. When the flash irradiation is performed, abrupt thermal expansion of the front surface of the semiconductor wafer W occurs to cause the semiconductor wafer W to become deformed. This causes the semiconductor wafer W to vibrate on the susceptor 74 or to jump up from the susceptor 74, resulting in the creation of particles. In the present preferred embodiment, the flow rate of nitrogen gas supplied into the chamber 6 is increased to 40 liters per minute immediately after the flash irradiation (although the time interval between the time t4 and the time t46 is approximately 15 milliseconds). This causes the created particles to be discharged from the chamber 6 efficiently, thereby preventing the particles from being deposited on the semiconductor wafer W. As a result, the particles deposited on the semiconductor wafer W are reduced when the flash irradiation is performed.

On the other hand, the increase in the flow rate of nitrogen gas supplied into the chamber 6 increases the influence of the nitrogen gas flow upon the temperature distribution of the semiconductor wafer W to impair the uniformity of the in-plane temperature distribution. If the flow rate of nitrogen gas supplied into the chamber 6 is maintained at 40 liters per minute throughout from the instant of the transport of the semiconductor wafer W into the chamber 6 to the instant of the transport thereof out of the chamber 6, the in-plane temperature distribution of the semiconductor wafer W is nonuniform during the preheating and during the flash heating. This results in an adverse effect on the results of the treatment.

To solve such a problem, the flow rate of nitrogen gas supplied into the chamber 6 in the present preferred embodiment is increased to 40 liters per minute at the time t46 at which the temperature of the front surface of the semiconductor wafer W is decreased from the treatment temperature T2 which is its maximum temperature at the time of the flash irradiation to become equal to the temperature of the back surface. The temperature of the front surface of the semiconductor wafer W at the time t46 at which the temperatures of the front and back surfaces of the semiconductor wafer W become equal to each other is considerably lower than the treatment temperature T2, and exerts no influence on the behavior of the impurities implanted in the front surface. The temperature of the front surface of the semiconductor wafer W which is decreased to such a low temperature does not present a problem if the in-plane temperature distribution is nonuniform because of the nitrogen gas flow, and exerts no influence on the results of the treatment. That is, the increase in the flow rate of nitrogen gas supplied into the chamber 6 to 40 liters per minute at the time t46 at which the temperature of the front surface of the semiconductor wafer W is decreased from the treatment temperature T2 to become equal to the temperature of the back surface achieves the reduction in particles deposited on the semiconductor wafer W while suppressing adverse effects resulting from the nonuniform in-plane temperature distribution. It should be noted that the preheating temperature T1 and the treatment temperature T2 are in general set at values which exert no influence on the behavior of the implanted impurities if the temperature distribution is disordered at the time when the temperature of the front surface of the semiconductor wafer W subjected to the flash irradiation becomes equal to the temperature of the back surface thereof.

Thereafter, the flow rate of nitrogen gas supplied into the chamber 6 is maintained at 40 liters per minute until time t7 at which the semiconductor wafer W is transported out of the chamber 6. That is, the flow rate of nitrogen gas supplied into the chamber 6 which is increased at the time t46 at which the temperatures of the front and back surfaces of the semiconductor wafer W become equal to each other is maintained at a constant value until the time t7 at which the semiconductor wafer W is transported out of the chamber 6.

The supply flow rate of nitrogen gas has been hitherto increased to prevent the outside atmosphere from being carried through the transport opening 66 into the chamber 6 when the semiconductor wafer W is transported into and out of the chamber 6 while the transport opening 66 is open. However, when the semiconductor wafer W is transported out of the chamber 6, the flow rate of nitrogen gas is increased while the semiconductor wafer W is present within the chamber 6. Thus, there has been a danger that particles within the chamber 6 swirl up due to a change in the velocity of the nitrogen gas flow, thereby being deposited on the semiconductor wafer W.

In the present preferred embodiment, the flow rate of nitrogen gas supplied into the chamber 6 which is increased at the time t46 at which the temperatures of the front and back surfaces of the semiconductor wafer W become equal to each other is maintained at a constant value until the time t7 at which the semiconductor wafer W is transported out of the chamber 6. Thus, there is no change in the velocity of the nitrogen gas flow also when the semiconductor wafer W is transported out of the chamber 6. As a result, particles do not swirl up within the chamber 6 when the semiconductor wafer W is transported out of the chamber 6. Thus, such particles are prevented from being deposited on the semiconductor wafer W.

While the preferred embodiment according to the present invention has been described hereinabove, various modifications of the present invention in addition to those described above may be made without departing from the scope and spirit of the invention. For example, the supply flow rate of nitrogen gas is increased at the time t46 at which the temperatures of the front and back surfaces of the semiconductor wafer W become equal to each other in the aforementioned preferred embodiment. However, the flow rate of nitrogen gas supplied into the chamber 6 may be increased when the temperature of the front surface of the semiconductor wafer W is decreased to a temperature at which the diffusion and inactivation of impurities implanted in the front surface do not occur. This also achieves the reduction in particles deposited on the semiconductor wafer W while suppressing adverse effects resulting from the nonuniform in-plane temperature distribution of the semiconductor wafer W.

Alternatively, the flow rate of nitrogen gas supplied into the chamber 6 may be increased when the temperature of the front surface of the semiconductor wafer W is decreased to the preheating temperature T1 after the flash irradiation. The time at which temperature of the front surface of the semiconductor wafer W is decreased to the preheating temperature T1 is later than the time t46 at which the temperatures of the front and back surfaces of the semiconductor wafer W become equal to each other. However, a certain amount of time is required until particles created during the flash irradiation are deposited on the semiconductor wafer W. Thus, the increase in the flow rate of nitrogen gas supplied into the chamber 6 at the time when the temperature of the front surface of the semiconductor wafer W is decreased to the preheating temperature T1 also achieves the reduction in particles deposited on the semiconductor wafer W while suppressing adverse effects resulting from the nonuniform in-plane temperature distribution of the semiconductor wafer W.

In summary, it is only necessary that the flow rate of nitrogen gas supplied into the chamber 6 is increased when the temperature of the front surface of the semiconductor wafer W is decreased to a predetermined temperature which exerts no influence on the behavior of the implanted impurities after reaching the treatment temperature T2 which is its maximum temperature by the flash irradiation performed on the semiconductor wafer W. In actuality, the response of the flow regulating valve 80 requires a reasonable amount of time as compared with the time interval between the instant at which the flash irradiation starts and the instant at which the temperatures of the front and back surfaces of the semiconductor wafer W become equal to each other. For this reason, there is no problem if the controller 3 applies a control signal to the flow regulating valve 80 so that the supply flow rate of nitrogen gas is increased at the same time as or slightly before the flash irradiation.

Changes in the flow rate of nitrogen gas supplied into the chamber 6 may be those shown in FIG. 12. The example shown in FIG. 12 is similar to that shown in FIG. 11 in that the nitrogen gas is supplied at a flow rate of 40 liters per minute from the time t0 at which the supply of nitrogen gas into the chamber 6 is started to the time t16 at which the transport opening 66 is closed and in that the flow rate is thereafter decreased to 20 liters per minute for the preheating treatment and the flash irradiation of the semiconductor wafer W. In the example shown in FIG. 12, the flow rate of nitrogen gas supplied into the chamber 6 is increased again to 40 liters per minute at time t48 at which approximately several seconds have elapsed since the flash irradiation was performed at the time t4. The flow rate of nitrogen gas supplied into the chamber 6 is maintained at 40 liters per minute until the time t7 at which the semiconductor wafer W is transported out of the chamber 6. In other words, the flow rate of nitrogen gas supplied into the chamber 6 is increased at any time between the irradiation of the semiconductor wafer W with a flash of light and the transport of the semiconductor wafer W out of the chamber 6, and the supply flow rate of nitrogen gas is maintained at a constant value until the semiconductor wafer W is transported out of the chamber 6. This gives rise to no change in the velocity of the nitrogen gas flow at least during the transport of the semiconductor wafer W out of the chamber 6 to prevent particles from swirling up during the transport of the semiconductor wafer W out of the chamber 6, thereby preventing such particles from being deposited on the semiconductor wafer W.

Changes in the flow rate of nitrogen gas supplied into the chamber 6 may be those shown in FIG. 13. In the example shown in FIG. 13, the flow rate of nitrogen gas supplied into the chamber 6 is maintained at 20 liters per minute from the time t0 at which the supply of nitrogen gas into the chamber 6 is started to the time t46 at which the temperatures of the front and back surfaces of the semiconductor wafer W subjected to the flash irradiation become equal to each other. Then, the flow rate of nitrogen gas supplied into the chamber 6 is increased to 40 liters per minute at the time t46 at which the temperature of the front surface of the semiconductor wafer W is decreased from the treatment temperature T2 which is its maximum temperature to become equal to the temperature of the back surface. Subsequently, the flow rate of nitrogen gas supplied into the chamber 6 is decreased to 20 liters per minute at time t49 that is any time between the instant of the irradiation of the semiconductor wafer W with a flash of light and the instant of the transport of the semiconductor wafer W out of the chamber 6. The flow rate of nitrogen gas supplied into the chamber 6 is maintained at 20 liters per minute until the semiconductor wafer W is transported out of the chamber 6.

In this manner, the flow rate of nitrogen gas supplied into the chamber 6 is increased to 40 liters per minute after the temperature of the front surface of the semiconductor wafer W is decreased to a temperature which exerts no influence on the behavior of the implanted impurities, as in the aforementioned preferred embodiment. This achieves the reduction in particles deposited on the semiconductor wafer W while suppressing adverse effects resulting from the nonuniform in-plane temperature distribution of the semiconductor wafer W. Also, no change occurs in the velocity of the nitrogen gas flow during the transport of the semiconductor wafer W out of the chamber 6. This prevents particles from swirling up during the transport of the semiconductor wafer W out of the chamber 6, thereby preventing such particles from being deposited on the semiconductor wafer W. It is, however, more preferable that the supply flow rate of nitrogen gas during the transport of the semiconductor wafer W into and out of the chamber 6 is a high flow rate as in the aforementioned preferred embodiment for the purpose of preventing the outside atmosphere from being carried through the transport opening 66 into the chamber 6 with reliability during the transport of the semiconductor wafer W into and out of the chamber 6.

Although the heat treatment is performed by irradiating the front surface of the semiconductor wafer W with a flash of light in the aforementioned preferred embodiment, the back surface of the semiconductor wafer W may be irradiated with a flash of light. Specifically, after the semiconductor wafer W is inverted or flipped upside down and then held by the holder 7 (i.e., held, with the front surface positioned to face downward), the treatment similar to that described in the aforementioned preferred embodiment may be performed. Also, a heat treatment apparatus configured such that the halogen heating part 4 is disposed over the chamber 6 whereas the flash heating part 5 is disposed under the chamber 6 may be used to perform the flash heating treatment.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Although the flow rate of nitrogen gas supplied into the chamber 6 is changed between 20 liters per minute and 40 liters per minute in the aforementioned preferred embodiment, the present invention is not limited to this. The flow rate of nitrogen gas supplied into the chamber 6 after the increase or the decrease may be set at an appropriate value depending on the volumetric capacity of the chamber 6 and the like. It is preferable that the flow rate of nitrogen gas is set at a value which allows the uniformity of the in-plane temperature distribution to be maintained when the preheating treatment and the flash heating treatment of the semiconductor wafer W are performed. It is, on the other hand, preferable that the flow rate of nitrogen gas is set at a value which allows particles to be effectively discharged from the chamber 6 when the flow rate of nitrogen gas is increased after the flash irradiation.

The gas supplied into the chamber 6 is not limited to nitrogen gas, but may be other inert gases such as argon (Ar) gas and helium (He) gas, for example. However, the supply of nitrogen gas as in the aforementioned preferred embodiment achieves lower costs.

Also, in the aforementioned preferred embodiment, the semiconductor wafer W is preheated by irradiating the semiconductor wafer W with halogen light from the halogen lamps HL. The technique for preheating is not limited to this, but the semiconductor wafer W may be preheated by placing the semiconductor wafer W on a hot plate.

Moreover, a substrate to be treated by the heat treatment apparatus according to the present invention is not limited to a semiconductor wafer, but may be a glass substrate for use in a flat panel display for a liquid crystal display apparatus and the like, and a substrate for a solar cell. Also, the technique according to the present invention may be applied to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate by irradiating the substrate with a flash of light, comprising:
    a chamber for receiving a substrate therein;
    a holder for holding the substrate in said chamber;
    a preheating part for heating the substrate held by said holder to a predetermined preheating temperature;
    a flash lamp for irradiating a first surface of the substrate held by said holder with a flash of light;
    a gas supply part for supplying an inert gas into said chamber;
    an exhaust part for exhausting an atmosphere from said chamber; and
    a flow rate controller configured to control the gas supply part to supply the inert gas into said chamber at a first flow rate, when the substrate held by said holder is being irradiated with a flash of light, and to increase the flow rate of the inert gas supplied from said gas supply part into said chamber from said first flow rate to a second flow rate when the temperature of said first surface of said substrate has decreased to a predetermined temperature after reaching its maximum temperature.

2. The heat treatment apparatus according to claim 1, wherein
    said flow rate controller increases the flow rate of the inert gas supplied from said gas supply part into said chamber when the temperature of said first surface of the substrate becomes equal to the temperature of a second surface of the substrate.

3. The heat treatment apparatus according to claim 1, wherein
    said flow rate controller increases the flow rate of the inert gas supplied from said gas supply part into said chamber when the temperature of said first surface of the substrate is decreased to a temperature at which the diffusion and inactivation of impurities implanted in said first surface do not occur.

4. The heat treatment apparatus according to claim 1, wherein
    said flow rate controller increases the flow rate of the inert gas supplied from said gas supply part into said chamber when the temperature of said first surface of the substrate is decreased to said preheating temperature.

5. The heat treatment apparatus according to claim 1, wherein
    said flow rate controller increases the flow rate of the inert gas supplied from said gas supply part into said chamber to a flow rate equal to that during the transport of the substrate out of said chamber when the temperature of said first surface of the substrate is decreased to said predetermined temperature.

6. A heat treatment apparatus for heating a substrate by irradiating the substrate with a flash of light, comprising:
    a chamber for receiving a substrate therein;
    a holder for holding the substrate in said chamber;

a preheating part for heating the substrate held by said holder to a predetermined preheating temperature;

a flash lamp for irradiating a first surface of the substrate held by said holder with a flash of light;

a gas supply part for supplying an inert gas into said chamber;

an exhaust part for exhausting an atmosphere from said chamber; and a flow rate controller configured to control the gas supply part to supply the inert gas into said chamber at a first flow rate, when the substrate held by said holder is being irradiated with a flash of light, and to increase the flow rate of the inert gas supplied from said gas supply part into said chamber from said first flow rate to a second flow rate at any time between the instant of the irradiation of said substrate with a flash of light and the instant of the transport of said substrate out of said chamber, and maintaining the flow rate at the second flow rate until the transport of said substrate out of said chamber.

7. A method of heating a substrate by irradiating the substrate with a flash of light, the method comprising the steps of:
   (a) heating a substrate held in a chamber to a predetermined preheating temperature;
   (b) irradiating a first surface of the substrate heated to said preheating temperature with a flash of light from a flash lamp; and
   (c) supplying an inert gas into said chamber at a first flow rate when said substrate is being irradiated with a flash of light, and increasing the flow rate of an inert gas supplied into said chamber from said first flow rate to a second flow rate when the temperature of said first surface of said substrate is decreased to a predetermined temperature after reaching its maximum temperature.

8. The method according to claim 7, wherein
   the flow rate of the inert gas supplied into said chamber is increased in said step (c) when the temperature of said first surface of the substrate becomes equal to the temperature of a second surface of the substrate.

9. The method according to claim 7, wherein
   the flow rate of the inert gas supplied into said chamber is increased in said step (c) when the temperature of said first surface of the substrate is decreased to a temperature at which the diffusion and inactivation of impurities implanted in said first surface do not occur.

10. The method according to claim 7, wherein
    the flow rate of the inert gas supplied into said chamber is increased in said step (c) when the temperature of said first surface of the substrate is decreased to said preheating temperature.

11. The method according to claim 7, wherein
    the flow rate of the inert gas supplied into said chamber is increased to a flow rate equal to that during the transport of the substrate out of said chamber in said step (c) when the temperature of said first surface of the substrate is decreased to said predetermined temperature.

12. A method of heating a substrate by irradiating the substrate with a flash of light, the method comprising the steps of:
    (a) heating a substrate held in a chamber to a predetermined preheating temperature;
    (b) irradiating a first surface of the substrate heated to said preheating temperature with a flash of light from a flash lamp; and
    (c) supplying an inert gas into said chamber at a first flow rate when said substrate is being irradiated with a flash of light, and increasing the flow rate of the inert gas supplied into said chamber from said first flow rate to a second flow rate at any time between the instant of the irradiation of said substrate with a flash of light and the instant of the transport of said substrate out of said chamber, and maintaining the flow rate at the second flow rate until the transport of said substrate out of said chamber.

* * * * *